(12) United States Patent
Yoshida et al.

(10) Patent No.: US 11,542,601 B2
(45) Date of Patent: Jan. 3, 2023

(54) SUBSTRATE PROCESSING APPARATUS AND METHOD OF MANUFACTURING SEMICONDUCTOR DEVICE

(71) Applicant: HITACHI KOKUSAI ELECTRIC INC., Tokyo (JP)

(72) Inventors: Hidenari Yoshida, Toyama (JP); Takeo Hanashima, Toyama (JP); Hiroaki Hiramatsu, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 893 days.

(21) Appl. No.: 16/047,611

(22) Filed: Jul. 27, 2018

(65) Prior Publication Data
US 2018/0371614 A1 Dec. 27, 2018

Related U.S. Application Data

(63) Continuation of application No. PCT/JP2016/053782, filed on Feb. 9, 2016.

(51) Int. Cl.
*C23C 16/455* (2006.01)
*H01L 21/67* (2006.01)
(Continued)

(52) U.S. Cl.
CPC ...... *C23C 16/45578* (2013.01); *C23C 16/402* (2013.01); *C23C 16/4412* (2013.01);
(Continued)

(58) Field of Classification Search
None
See application file for complete search history.

(56) References Cited

U.S. PATENT DOCUMENTS 4,745,088 A * 5/1988 Inoue ................. C23C 16/4584
117/98
5,441,570 A * 8/1995 Hwang ................ C23C 16/455
118/725
(Continued)

FOREIGN PATENT DOCUMENTS

JP 2002222806 A * 8/2002 ........... C23C 16/455
JP 2011-052319 A 3/2011
(Continued)

OTHER PUBLICATIONS

Korean Office Action dated Jul. 15, 2019 for the Korean Patent Application No. 10-2018-7009657.

*Primary Examiner* — Jeffrie R Lund
(74) *Attorney, Agent, or Firm* — Volpe Koenig (57) ABSTRACT

Described herein is a technique capable of improving the uniformity of the film formation among the substrates. According to the technique described herein, there is provided a configuration including: a reaction tube having a process chamber where a plurality of substrates are processed; a buffer chamber protruding outward from the reaction tube and configured to supply a process gas to the process chamber, the buffer chamber including: a first nozzle chamber where a first nozzle is provided; and a second nozzle chamber where a second nozzle is provided; an opening portion provided at a lower end of an inner wall of the reaction tube facing the buffer chamber; and a shielding portion provided at a communicating portion of the opening portion between the second nozzle chamber and the process chamber.

17 Claims, 6 Drawing Sheets

(51) Int. Cl.
*C23C 16/40* (2006.01)
*C23C 16/44* (2006.01)
*C23C 16/52* (2006.01)
*H01L 21/02* (2006.01)

(52) U.S. Cl.
CPC ........ *C23C 16/45502* (2013.01); *C23C 16/52* (2013.01); *H01L 21/02123* (2013.01); *H01L 21/67017* (2013.01); *H01L 21/67109* (2013.01); *H01L 21/0228* (2013.01); *H01L 21/02164* (2013.01); *H01L 21/02211* (2013.01); *H01L 21/67248* (2013.01)

(56) References Cited

U.S. PATENT DOCUMENTS

| | | | | |
|---|---|---|---|---|
| 6,251,189 B1* | 6/2001 | Odake | ............ | C30B 25/14 118/724 |
| 6,444,262 B1* | 9/2002 | Kitamura | ............ | C23C 16/4412 427/248.1 |
| D521,465 S * | 5/2006 | Ishii | ............ | D13/182 |
| D586,768 S * | 2/2009 | Inoue | ............ | D13/182 |
| D600,659 S * | 9/2009 | Matsuura | ............ | D13/182 |
| D610,559 S * | 2/2010 | Okada | ............ | D13/182 |
| D770,993 S * | 11/2016 | Yoshida | ............ | D13/182 |
| D772,824 S * | 11/2016 | Yoshida | ............ | D13/182 |
| D790,490 S * | 6/2017 | Osaka | ............ | D13/182 |
| D791,090 S * | 7/2017 | Yoshida | ............ | D13/182 |
| 10,808,318 B2* | 10/2020 | Hanashima | ............ | C23C 16/45574 |
| 10,811,271 B2* | 10/2020 | Yoshida | ............ | C23C 16/45561 |
| 10,950,457 B2* | 3/2021 | Yoshida | ............ | H01L 21/02211 |
| 10,961,625 B2* | 3/2021 | Saido | ............ | C23C 16/45546 |
| 11,094,572 B2* | 8/2021 | Morita | ............ | H01L 21/67309 D13/182 |
| 2001/0032704 A1* | 10/2001 | Tesauro | ............ | H01L 21/67115 156/345.31 |
| 2002/0134507 A1* | 9/2002 | DeDontney | ............ | C23C 16/45576 156/345.33 |
| 2002/0168854 A1* | 11/2002 | Tometsuka | ............ | C23C 16/4411 118/724 |
| 2003/0015138 A1* | 1/2003 | Tometsuka | ............ | C23C 16/45519 118/715 |
| 2003/0049372 A1* | 3/2003 | Cook | ............ | H01L 21/67017 427/248.1 |
| 2003/0164143 A1* | 9/2003 | Toyoda | ............ | H01L 21/205 118/723 E |
| 2003/0186560 A1* | 10/2003 | Hasebe | ............ | C23C 16/45578 438/778 |
| 2004/0025786 A1* | 2/2004 | Kontani | ............ | C23C 16/45578 118/715 |
| 2005/0069015 A1* | 3/2005 | Bogdahn | ............ | C03B 23/043 373/111 |
| 2006/0016805 A1* | 1/2006 | Del Regno | ............ | H05B 6/80 |
| 2006/0046059 A1* | 3/2006 | Arico | ............ | C23C 16/045 |
| 2006/0150905 A1* | 7/2006 | Sakai | ............ | C23C 16/455 118/715 |
| 2006/0185589 A1* | 8/2006 | Zehavi | ............ | C23C 16/4583 118/715 |
| 2007/0062448 A1* | 3/2007 | Maeda | ............ | C23C 16/45574 118/715 |
| 2007/0181066 A1* | 8/2007 | Cadwell | ............ | H01L 21/67109 118/725 |
| 2007/0234961 A1* | 10/2007 | Takahashi | ............ | C23C 16/345 118/723 R |
| 2007/0240644 A1* | 10/2007 | Matsuura | ............ | C23C 16/45574 118/715 |
| 2008/0044785 A1* | 2/2008 | Anbai | ............ | H01L 21/67109 432/241 |
| 2008/0083372 A1* | 4/2008 | Inoue | ............ | C23C 16/345 118/725 |
| 2008/0153308 A1* | 6/2008 | Ogawa | ............ | C23C 16/452 438/758 |
| 2008/0311760 A1* | 12/2008 | Nodera | ............ | H01L 21/3141 438/791 |
| 2009/0023301 A1* | 1/2009 | Ookoshi | ............ | H01L 21/0228 438/792 |
| 2009/0029561 A1* | 1/2009 | Fukuda | ............ | C23C 16/45591 438/758 |
| 2009/0116936 A1* | 5/2009 | Marubayashi | .... | H01L 21/67248 414/148 |
| 2009/0124083 A1* | 5/2009 | Nodera | ............ | C23C 16/452 438/694 |
| 2009/0205783 A1* | 8/2009 | Tanabe | ............ | C30B 25/14 156/345.37 |
| 2009/0255468 A1* | 10/2009 | Yamamoto | ............ | C23C 16/4584 118/723 E |
| 2009/0291566 A1* | 11/2009 | Ueno | ............ | H01L 21/67769 438/758 |
| 2009/0305512 A1* | 12/2009 | Matsuura | ............ | F27B 17/0025 438/758 |
| 2009/0308315 A1* | 12/2009 | De Ridder | ............ | C09D 1/00 118/715 |
| 2010/0035437 A1* | 2/2010 | Yamazaki | ............ | F16L 25/00 438/758 |
| 2010/0051597 A1* | 3/2010 | Morita | ............ | H01L 21/67109 219/201 |
| 2010/0055918 A1* | 3/2010 | Nakada | ............ | C23C 16/4401 438/758 |
| 2010/0186898 A1* | 7/2010 | Fukushima | ............ | C23C 16/345 156/345.48 |
| 2010/0240217 A1* | 9/2010 | Kushibiki | ......... | H01L 21/31122 438/694 |
| 2011/0000425 A1* | 1/2011 | Saido | ............ | C30B 25/165 117/88 |
| 2011/0031593 A1* | 2/2011 | Saito | ............ | C23C 16/45544 257/632 |
| 2011/0212599 A1* | 9/2011 | Kuribayashi | ..... | H01L 21/67109 438/478 |
| 2012/0067869 A1* | 3/2012 | Shirako | ............ | F28F 1/00 219/618 |
| 2012/0100722 A1* | 4/2012 | Asai | ............ | C23C 16/4408 438/758 |
| 2012/0119337 A1* | 5/2012 | Sasaki | ............ | C23C 16/45578 257/632 |
| 2012/0180727 A1* | 7/2012 | Hasegawa | ............ | C23C 16/45578 118/730 |
| 2012/0199067 A1* | 8/2012 | Morozumi | ............ | C23C 16/4412 118/719 |
| 2012/0231407 A1* | 9/2012 | Kadobe | ............ | F27B 17/0025 432/247 |
| 2013/0042803 A1* | 2/2013 | Saido | ............ | C23C 16/45578 117/88 |
| 2013/0072027 A1* | 3/2013 | Ota | ............ | C23C 16/45542 438/762 |
| 2013/0167774 A1* | 7/2013 | Yang | ............ | C23C 16/45568 118/728 |
| 2014/0261174 A1* | 9/2014 | Yang | ............ | C23C 16/54 118/715 |
| 2014/0283750 A1* | 9/2014 | Okada | ............ | H01L 21/67303 118/730 |
| 2014/0287594 A1* | 9/2014 | Terasaki | ............ | H01L 21/02211 438/770 |
| 2014/0348617 A1* | 11/2014 | Yang | ............ | H01L 21/67757 414/172 |
| 2014/0357058 A1* | 12/2014 | Takagi | ............ | C23C 16/402 438/478 |
| 2015/0013909 A1* | 1/2015 | Yang | ............ | C23C 16/4584 156/345.29 |
| 2015/0107517 A1* | 4/2015 | Hasebe | ............ | C23C 16/452 118/723 E |
| 2015/0144060 A1* | 5/2015 | Park | ............ | C23C 16/54 D13/182 |
| 2015/0270125 A1* | 9/2015 | Sasaki | ............ | H01L 21/02186 D13/182 |
| 2016/0064190 A1* | 3/2016 | Noh | ............ | H01J 37/32779 D13/182 |
| 2016/0245704 A1* | 8/2016 | Osaka | ............ | C23C 16/4408 |
| 2016/0284539 A1* | 9/2016 | Horita | ............ | H01L 21/02211 D13/182 |

(56) References Cited

U.S. PATENT DOCUMENTS

| | | | | |
|---|---|---|---|---|
| 2016/0298235 A1* | 10/2016 | Terasaki | .............. | H01L 21/0228 |
| | | | | D13/182 |
| 2017/0037512 A1* | 2/2017 | Saido | .................. | C23C 16/4408 |
| 2017/0294318 A1* | 10/2017 | Yoshida | .............. | H01L 21/0228 |
| | | | | 438/792 |
| 2018/0371614 A1* | 12/2018 | Yoshida | .................. | C23C 16/52 |
| | | | | D13/182 |
| 2019/0017169 A1* | 1/2019 | Hanashima | ........ | C23C 16/45546 |
| 2021/0159083 A1* | 5/2021 | Yoshida | ............ | C23C 16/45576 |
| | | | | 156/345.33 |

FOREIGN PATENT DOCUMENTS

| | | | | | |
|---|---|---|---|---|---|
| JP | 2012-114200 A | | 6/2012 | | |
| JP | 2012114200 A | * | 6/2012 | ........... | C23C 16/455 |
| JP | 2014-209572 A | | 11/2014 | | |
| JP | 1546345 S | * | 3/2016 | | |
| JP | 2016184685 A | * | 10/2016 | ........... | C23C 16/401 |
| WO | 2015/041376 A1 | | 3/2015 | | |
| WO | WO-2015041376 A1 | * | 3/2015 | ............. | H01L 21/31 |
| WO | WO-2017168513 A1 | * | 10/2017 | ............. | C23C 16/44 |

\* cited by examiner

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2016/053782, filed on Feb. 9, 2016, in the WIPO, the entire contents of which are hereby incorporated by reference.

BACKGROUND

1. Field

The present disclosure relates to a substrate processing apparatus and a method of manufacturing a semiconductor device.

2. Description of the Related Art

Substrate processing, which is one of semiconductor device manufacturing processes, is performed using a vertical type substrate processing apparatus that batch-processes a plurality of substrates. Nozzles of various shapes are used in the vertical type substrate processing apparatus. The film formation may be adversely affected depending on the shapes of the nozzles provided in the vertical type substrate processing apparatus.

SUMMARY

Described herein is a technique capable of improving the uniformity of the film formation among the substrates.

According to one aspect of the technique described herein, there is provided a configuration including: a reaction tube having a process chamber where a plurality of substrates are processed; a buffer chamber protruding outward from the reaction tube and configured to supply a process gas to the process chamber, the buffer chamber including: a first nozzle chamber where a first nozzle is provided; and a second nozzle chamber where a second nozzle is provided; an opening portion provided at a lower end of an inner wall of the reaction tube facing the buffer chamber; and a shielding portion provided at a communicating portion of the opening portion between the second nozzle chamber and the process chamber

DETAILED DESCRIPTION

Hereinafter, an embodiment will be described below by way of a non-limiting example with reference to the accompanying drawings. In the drawings, like reference numerals represent like components and detailed descriptions of redundant components will be omitted.

Figure 1:
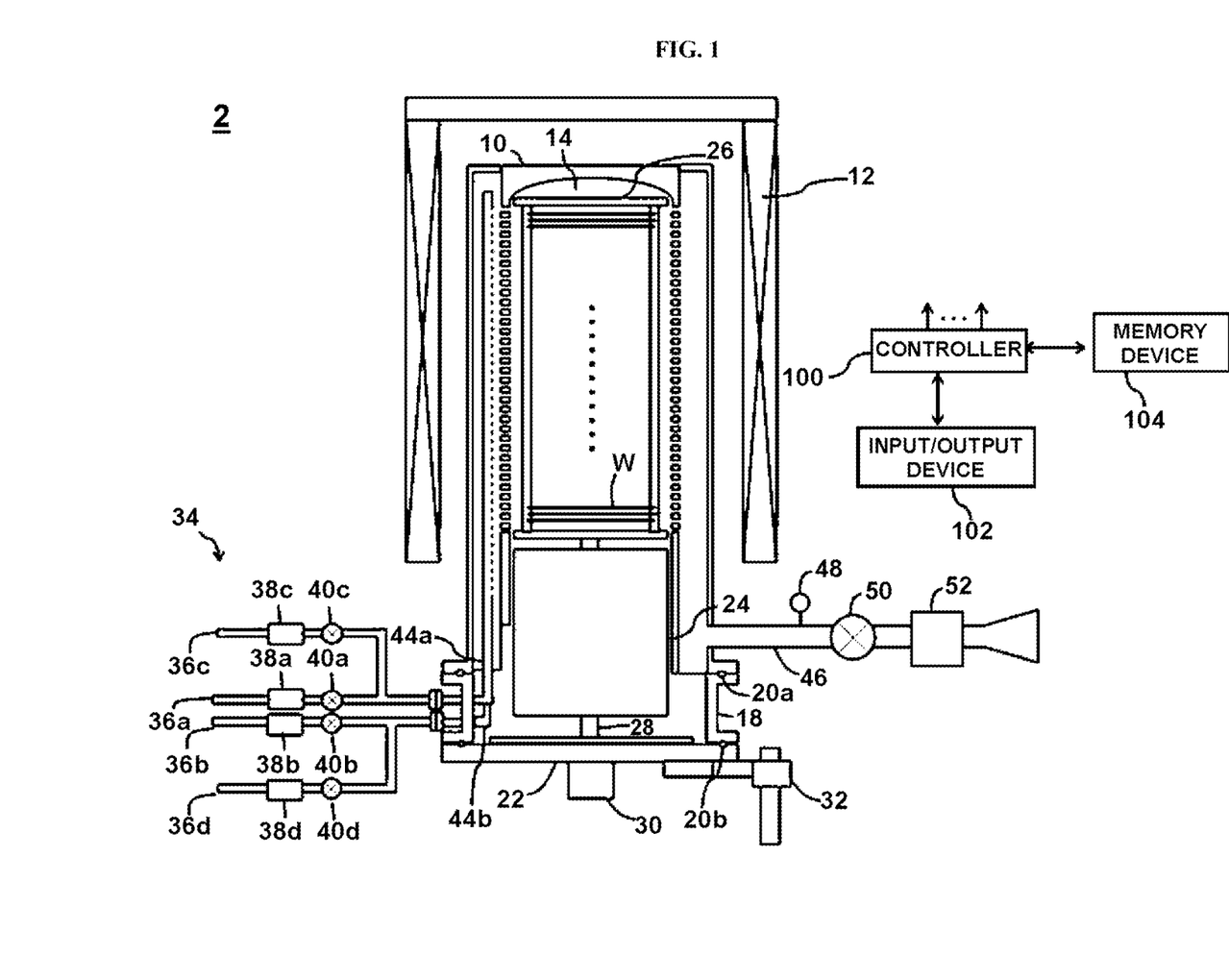
FIG. 1 schematically illustrates a vertical cross-section of a substrate processing apparatus according to an embodiment described herein.

A substrate processing apparatus according to the embodiment includes a vertical type substrate processing apparatus 2 (hereinafter also referred to simply as a "processing apparatus") that performs a substrate processing such as thermal treatment, which is one of the semiconductor device manufacturing processes. As shown in FIG. 1, the processing apparatus 2 includes a cylindrical reaction tube 10 and a heater 12 which is a heating mechanism provided at the outer periphery of the reaction tube 10. The reaction tube 10 is made of a material such as quartz and silicon carbide (SiC).

Figure 2:
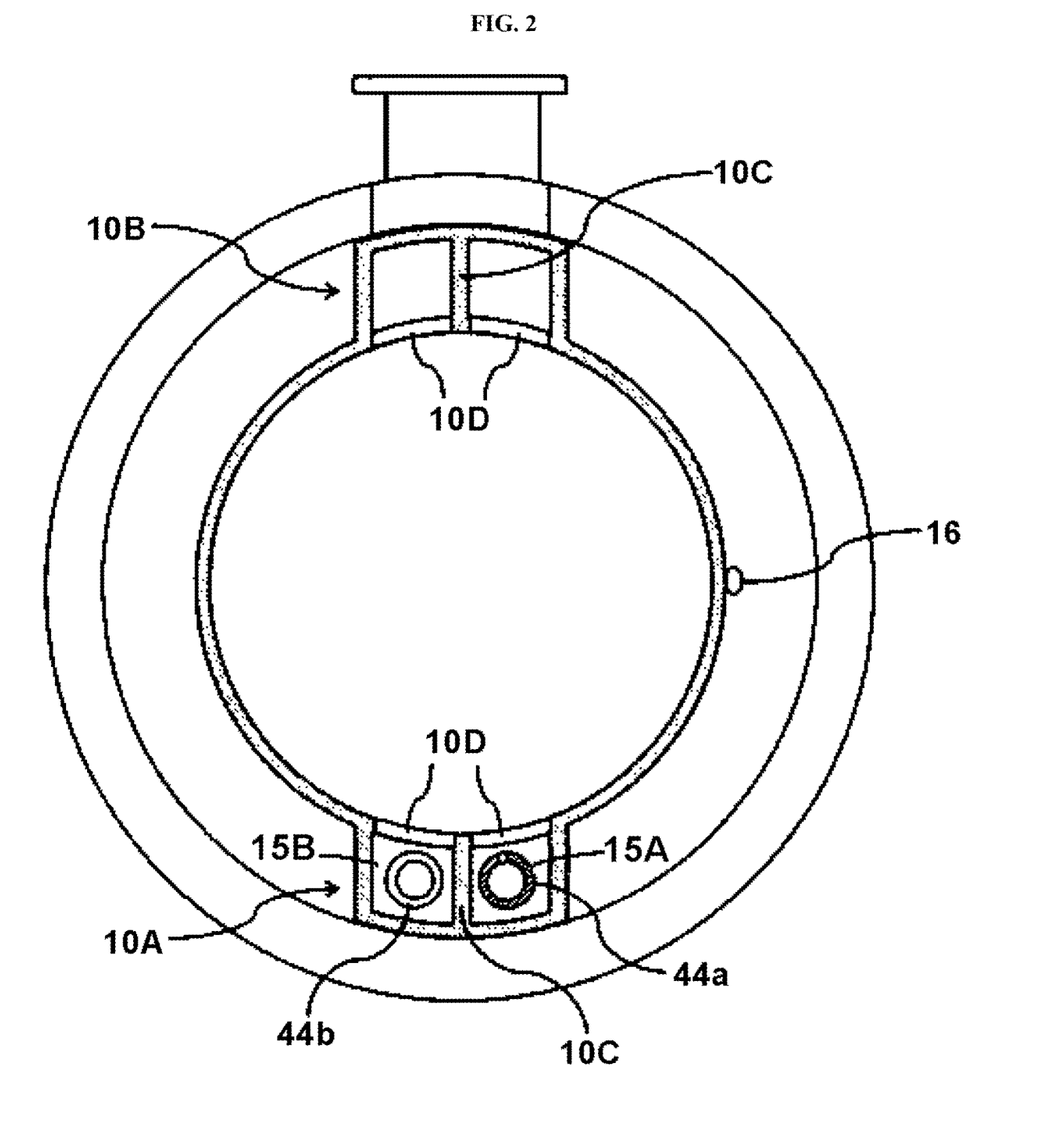
FIG. 2 schematically illustrates a horizontal cross-section of the substrate processing apparatus according to the embodiment.

As shown in FIG. 2, a supply buffer chamber 10A and an exhaust buffer chamber 10B are provided in the reaction tube 10 so as to face each other. The supply buffer chamber 10A and the exhaust buffer chamber 10B protrude outward from the cylindrical portion of the reaction tube 10. The interior of the supply buffer chamber 10A is partitioned into a plurality of spaces (nozzle chambers) by partition walls 10C. A nozzle chamber 15A and a nozzle chamber 15B are defined by the supply buffer chamber 10A and the partition walls 10C. Nozzles 44a and 44b described later are provided in the nozzle chambers 15A and 15B, respectively. The interior of the exhaust buffer chamber 10B is partitioned into a plurality of spaces by the partition walls 10C so as to correspond to nozzle chambers 15A and 15B. Slits 10D are provided in multiple stages in the longitudinal direction on the inner wall of the reaction tube 10 facing the supply buffer chamber 10A and the exhaust buffer chamber 10B. A process chamber 14 is defined by the inner wall of the reaction tube 10. The slits 10D are provided on the inner wall so as to correspond to the nozzle chambers 15A and 15B and the plurality of spaces of the exhaust buffer chamber 10B, respectively. The process chamber 14 is provided in the cylindrical portion of the reaction tube 10. A wafer W serving as a substrate is processed in the process chamber 14. A temperature detector 16 serving as a temperature detecting mechanism is provided vertically along the outer wall of the reaction tube 10.

A cylindrical manifold 18 is connected to an opening portion at a lower end of the reaction tube 10 via a sealing member 20a such as an O-ring. The manifold 18 supports the reaction tube 10 from thereunder. The inner diameter of the manifold 18 is substantially the same as the outer diameter of the buffer chamber 10A. The manifold 18 is made of a metal such as stainless steel. The opening portion at a lower end of the manifold 18 may be closed by a disk-shaped lid 22. The lid 22 is made of, for example, metal. A sealing member 20b such as an O-ring is provided on the upper surface of the lid 22. The reaction tube 10 is hermetically sealed by the sealing members 20a and 20b. A heat insulating portion 24 is provided on the lid 22. A hole (not shown) is provided vertically at the center portion of the heat insulating portion 24. The heat insulating portion 24 is made of, for example, quartz.

A boat 26, which is a substrate retainer for vertically supporting a plurality of wafers W (e.g., 25 to 150 wafers) in multiple stages, may be accommodated in the process chamber 14. The boat 26 is made of a material such as quartz and SiC. The boat 26 is supported above the heat insulating portion 24 by a rotating shaft 28 penetrating the lid 22 and the hole of the heat insulating portion 24. For example, a magnetic fluid seal (not shown) is provided at a portion where the rotating shaft 28 penetrates the lid 22 to hermetically seal the inside of the reaction tube 10 while the rotating shaft 28 is rotated. The rotating shaft 28 is connected to a rotating mechanism 30 provided below the lid 22. The lid 22 is moved up and down by a boat elevator 32 which is an elevating mechanism. The boat 26 and the lid 22 are thereby moved up and down together, and the boat 26 is loaded into or unloaded from the reaction tube 10.

The processing apparatus 2 includes a gas supply mechanism 34 configured to supply gases used for the substrate processing into the process chamber 14. The gases supplied by the gas supply mechanism 34 may be changed depending on the type of the film to be formed. According to the embodiment, for example, the gas supply mechanism 34 includes a source gas supply system, a reactive gas supply system and an inert gas supply system.

The reactive gas supply system includes a gas supply pipe 36a. A mass flow controller (MFC) 38a which is a flow rate controller and a valve 40a which is an opening/closing valve are provided at the gas supply pipe 36a in order from the upstream side to the downstream side of the gas supply pipe 36a. The gas supply pipe 36a is connected to a nozzle 44a via a port (not shown) which penetrates a sidewall of the manifold 18. The nozzle 44a is provided in the nozzle chamber 15A of the supply buffer chamber 10A and vertically extends in the nozzle chamber 15A to the height of the uppermost wafer W accommodated in the boat 26. A plurality of supply holes (gas ejection holes) open toward the wafers W supported by the boat 26 are provided in the nozzle 44a. Hereinafter, a nozzle having a shape similar to that of the nozzle 44a is also referred to as a "long nozzle". A reactive gas is diffused into the supply buffer chamber 10A through the plurality of supply holes of the nozzle 44a and is supplied to the wafers W through the slits 10D of the supply buffer chamber 10A.

The source gas supply system will be described below. The source gas supply system includes a gas supply pipe 36b. A mass flow controller (WC) 38b and a valve 40b are provided at the gas supply pipe 36b. The gas supply pipe 36b is connected to a nozzle 44b. In the embodiment, the nozzle 44b is, for example, a short pipe (short nozzle) having an open front end. A supply hole (gas ejection hole) is provided at the front end of the nozzle 44b. The nozzle 44b is provided such that the supply hole of the nozzle 44b is located at substantially the same height as the height of the lowermost wafer W accommodated in the boat 26. A source gas is diffused into the supply buffer chamber 10A through the supply hole provided at the front end of the nozzle 44b and is supplied to the wafers W through the slits 10D of the supply buffer chamber 10A. An inert gas is supplied from the inert gas supply system to the wafers W via supply pipes 36c and 36d, mass flow controllers (MFCs) 38c and 38d, valves 40c and 40d, nozzles 44a and 44b, and the slits 10D.

An exhaust pipe 46 is provided at the reaction tube 10. The exhaust pipe 46 is connected to the exhaust buffer chamber 10B. A vacuum pump 52, which is a vacuum exhaust device, is connected to the exhaust pipe 46 via a pressure sensor 48 serving as a pressure detecting device configured to detect the inner pressure of the process chamber 14 and an APC (automatic pressure controller) valve 50 serving as a pressure adjusting device (pressure controller). The inner pressure of the process chamber 14 may be adjusted to a pressure suitable for the substrate processing by these components.

Figure 3:
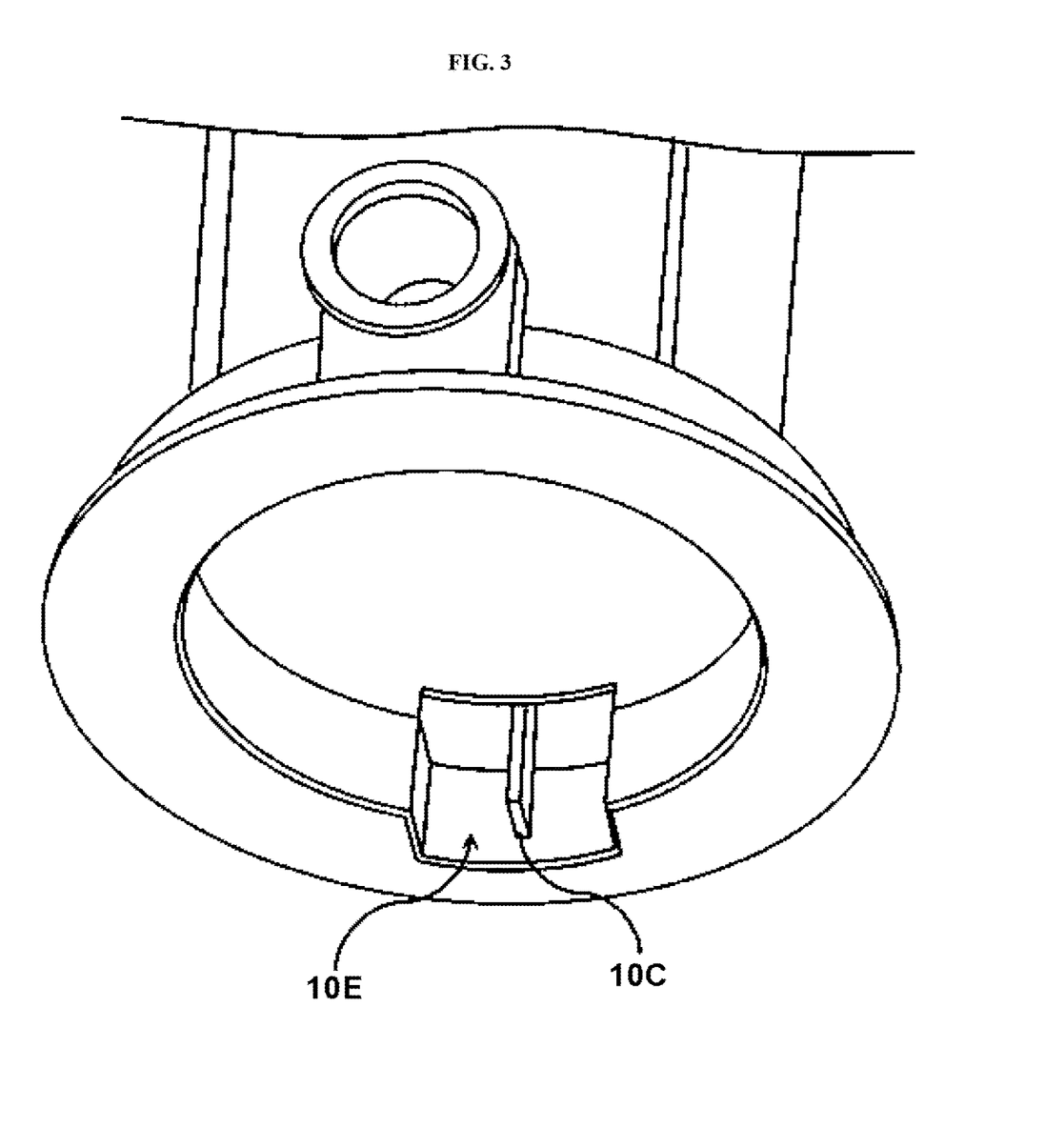
FIG. 3 is a diagram schematically illustrating a perspective view of a reaction tube of the substrate processing apparatus according to the embodiment.
Figure 4:
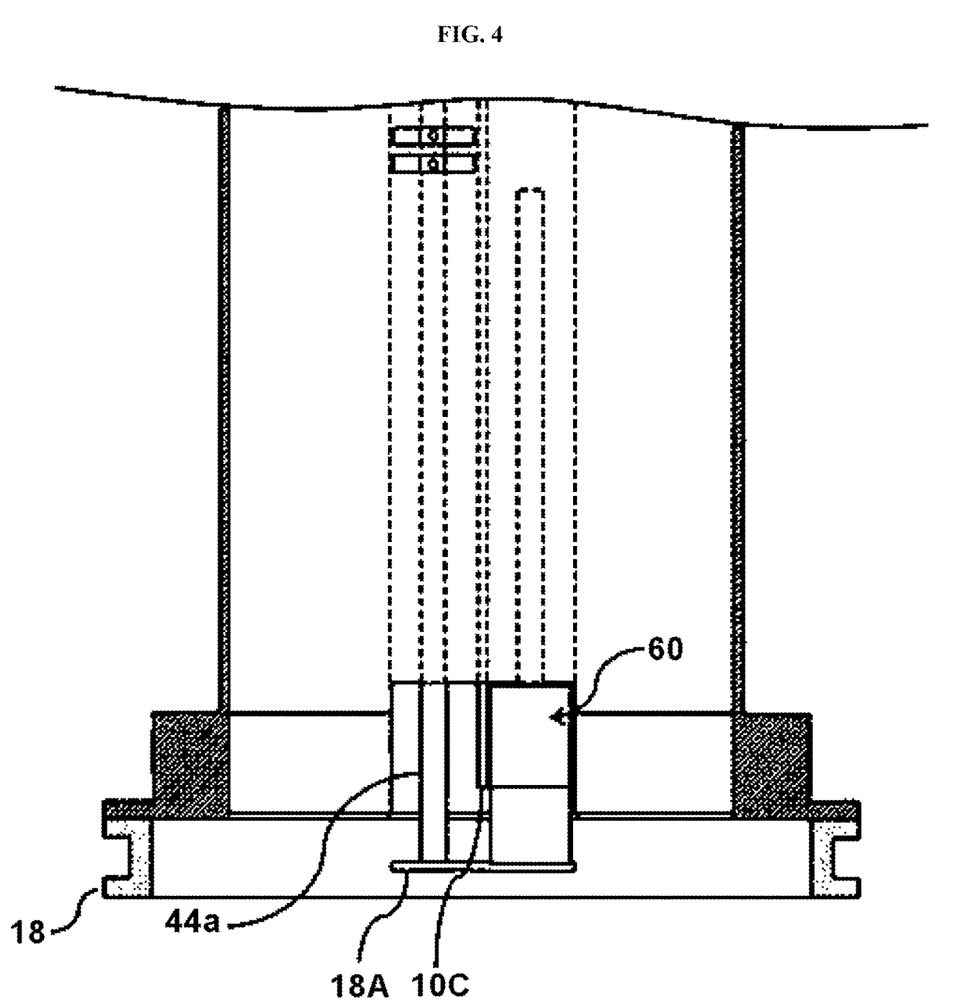
FIG. 4 is a vertical cross-section of the substrate processing apparatus provided with a shielding portion according to the embodiment.

According to the embodiment, as shown in FIG. 3, an opening portion 10E is provided at the lower end of the inner wall of the cylindrical portion of the reaction tube 10 facing the supply buffer chamber 10A. The opening portion 10E is configured to communicate the supply buffer chamber 10A and the process chamber 14 with each other. As shown in FIG. 4, a port (not shown) is provided at the inner wall of the manifold 18 below the opening portion 10E so as to correspond to the nozzle chambers 15A and 15B. A nozzle base 18A is provided below the port. The nozzles 44a and 44b are inserted into the nozzle chambers 15A and 15B through the opening portion 10E, respectively. Horizontal portions of the lower end of the nozzles 44a and 44b, that is, nozzle base portions (not shown), are inserted into the port. The nozzle base portions are then fixed to the nozzle base 18A. Thus, the nozzles 44a and 44b are stably installed in the nozzle chambers 15A and 15B, respectively. The opening portion 10E may include portions corresponding to the nozzle base portions, that is, a space below the partition walls 10C where the nozzle base portions are located.

By providing the opening portion 10E, it is possible to detach the nozzles 44a and 44b from the inside of the reaction tube 10 (the side where the process chamber 14 is provided) during maintenance such as nozzle replacement. Thus, it is possible to omit the operation of removing the reaction tube 10. As a result, the maintenance time can be shortened.

However, when the gas is supplied into the supply buffer chamber 10A through the nozzles 44a and 44b, the gas flows into the process chamber 14 via the opening portion 10E. The gas may not diffuse sufficiently upward to the supply buffer chamber 10A, in particular, to the upper portion of the supply buffer chamber 10A. As a result, there is a difference in flow rates of the gas supplied to the wafers W accommodated in the boat 26, so that the uniformity of the film formation among the wafers (substrates) may deteriorate.

Since the distance between the supply hole of the short nozzle (nozzle 44b) and the opening portion 10E is short, the gas may easily flow out via the opening portion 10E. As a result, the gas supplied through the short nozzle is difficult to diffuse in the supply buffer chamber 10A. There may be a difference in flow rates of the gas supplied to the wafers W accommodated in the boat 26.

The inventors of the present application have confirmed that the gas outflow can be suppressed by providing a cover as a shielding portion in the opening portion 10E. In particular, by providing the cover in the lower opening portion of the nozzle chamber such as the nozzle chamber 15B where the short nozzle is provided. The lower opening portion of the nozzle chamber is the communicating portion between the nozzle chamber such as the nozzle chamber 15B and the process chamber 14. The gas may easily flow out when the short nozzle is used. The inventors have confirmed that the uniformity of the film formation among the wafers (substrates) can improved by 35% when the cover is provided, as compared with the case where the cover is not provided.

As shown in FIG. 4, a cover 60 serving as the shielding portion is provided to cover the lower opening portion, which is part of the opening portion 10E, of the nozzle chamber 15B. As described above, the nozzle 44b (short nozzle) is provided in the nozzle chamber 15B. As a result, the nozzle chamber 15B and the process chamber 14 are isolated from each other. It is possible to prevent the gas supplied through the nozzle 44b to the supply buffer chamber 10A from flowing out to the process chamber 14 via the opening portion 10E.

Figure 5:
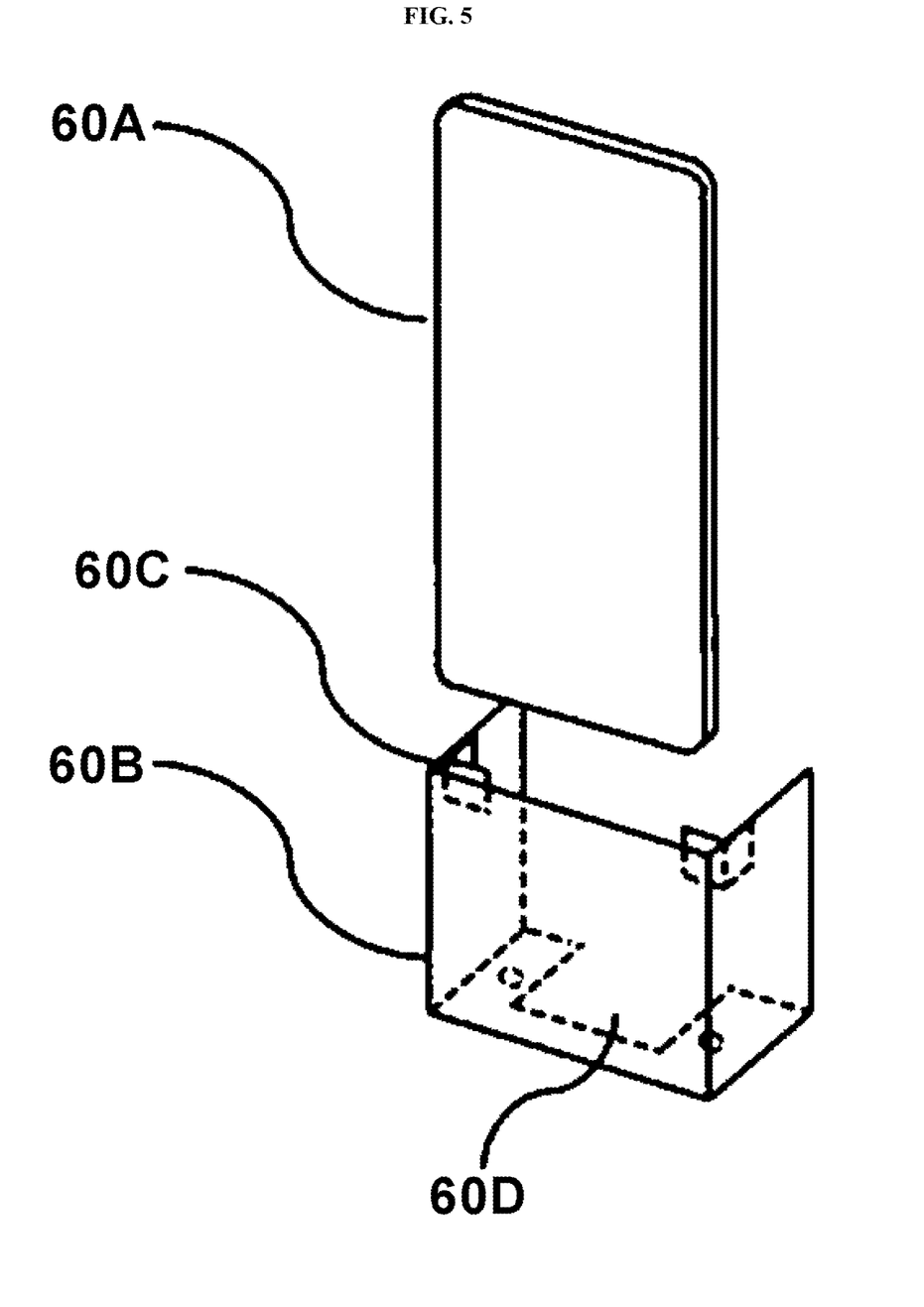
FIG. 5 is a diagram schematically illustrating a perspective view of the shielding portion.

As shown in FIG. 5, the cover 60 includes a plate 60A and a support portion 60B supports the plate 60A. The plate 60A is configured to cover a part of the opening portion 10E corresponding to the partition walls 10C, that is, between the partition walls 10C. The plate 60A is made of the same material as the reaction tube 10. For example, the plate 60A is made of quartz.

The support portion 60B is configured to define and cover a portion of the opening portion 10E corresponding to the nozzle base portions. The support portion 60B includes a back plate, side plates extending continuously from both ends of the back plate, and a bottom plate. On side plates of the support portion 60B, plug-shaped insert portions 60C for inserting the plate 60A are provided. A cutout portion 60D is provided at the bottom plate of the support portion 60B so as to avoid interference with the nozzle base portions. The cover 60 is installed in the opening portion 10E by fixing the bottom plate of the support portion 60B to the nozzle base 18A. A hole for fixing the cover 60 to the nozzle base 18A is provided in the bottom plate. With the above-described configuration, the cover 60 can selectively cover the opening portion 10E of the nozzle chamber such as nozzle chamber 15B. The support portion 60B is made of a high corrosion resistant alloy such as nickel (Ni) alloy.

As shown in FIG. 4, the cover 60 does not completely seal the opening portion 10E. A gap is provided between the plate 60A and the partition walls 10C so that the plate 60A and the partition walls 10C do not contact each other. Similarly, a gap is provided between the side plates of the support portion 60B and the partition walls 10C so that the side plates of the support portion 60B and the partition walls 10C do not contact each other.

A controller 100 is connected to and controls the rotating mechanism 30, the boat elevator 32, the MFCs 38a through 38d and the valves 40a through 40d of the gas supply mechanism 34 and the APC valve 50. For example, the controller 100 is embodied by a microprocessor (computer) having a CPU, and is configured to control the operations of the processing apparatus 2. An input/output device 102 such as a touch panel is connected to the controller 100.

A memory device 104, which is a recording medium, is connected to the controller 100. A control program for controlling the operations of the processing apparatus 2 or a program (also referred to as a recipe) for controlling components of the processing apparatus 2 according to process conditions to perform processing is readably stored in the memory device 104. The program is also referred to as a "recipe".

The memory device 104 may be embodied by a built-in memory device (such as a hard disk and a flash memory) of the controller 100 or a portable external recording device (e, g, magnetic tapes, magnetic disks such as a flexible disk and a hard disk, optical discs such as CD and DVD, magneto-optical discs such as MO, and semiconductor memories such as USB memories and memory cards). The program may be provided to the computer using a communication means such as the Internet and a dedicated line. The program is read from the memory device 104 by instructions such as input from the input/output device 102. The processing apparatus 2 performs the desired processing according to the recipe when the controller 100 executes the recipe.

Figure 6:
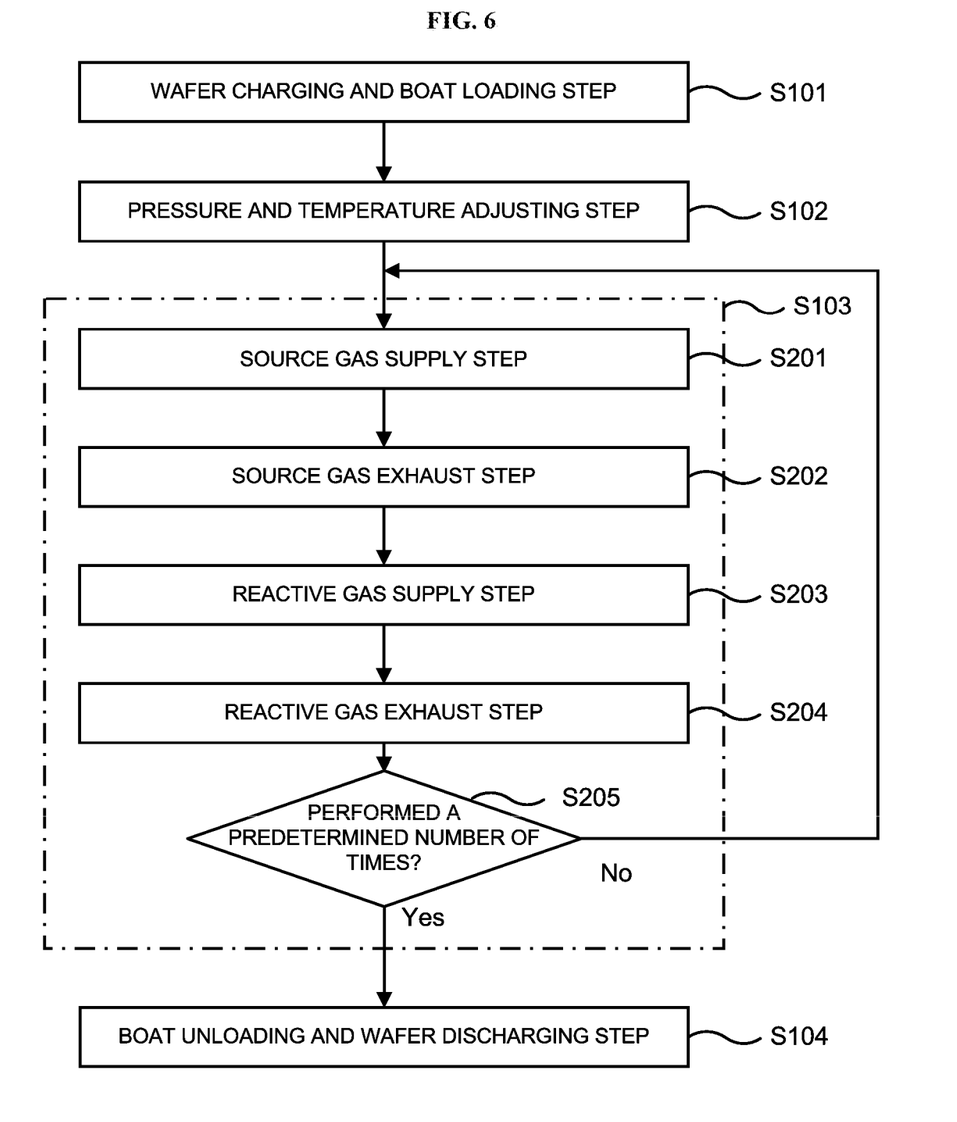
FIG. 6 is a flowchart illustrating a film-forming process according to the embodiment.

Next, a process for forming a film on a substrate (also referred to as "film-forming process") using the above-described processing apparatus 2 will be described with reference to FIG. 6. FIG. 6 is a flowchart illustrating the film-forming process according to the embodiment. Hereinafter, the film-forming process will be described by way of an example wherein a silicon oxide ($SiO_2$) film is formed on the wafer W by supplying a silicon-containing gas, for example, DCS ($SiH_2Cl_2$: dichlorosilane gas), as the source gas to the wafer W and supplying an oxygen-containing gas, for example, oxygen ($O_2$) gas, as the reactive gas to the wafer W. In the following description, the controller 100 controls the operations of components of the processing apparatus 2.

<Wafer Charging and Boat Loading Step S101>

After the boat 26 is charged with a plurality of wafers W (wafer charging step), the boat 26 is loaded into the process chamber 14 by the boat elevator 32 (boat loading step). The opening portion at the lower end of the reaction tube 10 is airtightly sealed by the lid 22.

<Pressure and Temperature Adjusting Step S102>

The vacuum pump 52 vacuum-evacuates (depressurizes and exhausts) the inside of the process chamber 14 until the inner pressure of the process chamber 14 reaches a predetermined pressure (vacuum level). The inner pressure of the process chamber 14 is measured by the pressure sensor 48 and the APC valve 50 is feedback-controlled based on the measured pressure. The heater 12 heats the process chamber 14 until the temperature of the wafer W in the process chamber 14 reaches a predetermined temperature. At this time, the energization state of the heater 12 is feedback-controlled based on the temperature detected by the temperature detector 16 such that the temperature of the process chamber 14 satisfies a predetermined temperature distribution. The rotating mechanism 30 starts to rotate the boat 26 and the wafer W.

<Film-Forming Step S103>

<Source Gas Supply Step S201>

Next, DCS gas is supplied to the wafer W in the process chamber 14. The flow rate of the DCS gas is adjusted to a desired flow rate by the MFC 38b. The DCS gas having the flow rate thereof adjusted is diffused into the nozzle chamber 15B via the gas supply pipe 36b and the nozzle 44b, and is supplied into the process chamber 14 via the slits 10D.

<Source Gas Exhaust Step S202>

Next, the supply of the DCS gas is stopped, and the vacuum pump 52 vacuum-exhausts the inside of the process chamber 14. Simultaneously, $N_2$ gas serving as an inert gas may be supplied into the process chamber 14 through the inert gas supply system (purge by inert gas).

<Reactive Gas Supply Step S203>

Next, after the temperature of the process chamber 14 is stabilized at a predetermined processing temperature, $O_2$ gas is supplied to the wafer W in the process chamber 14. The flow rate of the $O_2$ gas is adjusted to a desired flow rate by the MFC 38a. The $O_2$ gas having the flow rate thereof adjusted is diffused into the nozzle chamber 15A via the gas supply pipe 36a and the nozzle 44a, and is supplied into the process chamber 14 via the slits 10D.

<Reactive Gas Exhaust Step S204>

Next, the supply of the $O_2$ gas is stopped, and the vacuum pump 52 vacuum-exhausts the inside of the process chamber 14. Simultaneously, $N_2$ gas may be supplied into the process chamber 14 through the inert gas supply system (purge by inert gas).

By performing a cycle including the four steps described above a predetermined number of time (one or more times) (S205), a $SiO_2$ film having a predetermined composition and a predetermined thickness may be formed on the wafer W.

<Boat Unloading and Wafer Discharging Step S104>

After the film having the predetermined film thickness is formed, $N_2$ gas is supplied by the inert gas supply system to replace the inner atmosphere of the process chamber 14 with $N_2$ gas, and the pressure of the process chamber 14 is returned to atmospheric pressure. The lid 22 is then lowered by the boat elevator 32 and the boat 26 is unloaded from the reaction tube 10 (boat unloading). Thereafter, the processed wafer W is discharged from the boat 26 (wafer discharging).

For example, the process conditions for forming the $SiO_2$ film on the wafer W are as follows:
Temperature (wafer temperature): 300° C. to 700° C.;
Pressure (the inner pressure of the process chamber): 1 Pa to 4,000 Pa;
Flow rate of DCS gas: 100 sccm to 10,000 sccm;
Flow rate of $O_2$ gas: 100 sccm to 10,000 sccm; and
Flow rate of $N_2$ gas: 100 sccm to 10,000 sccm.

By selecting suitable values within these process conditions, the film-forming process may be performed properly.

<Effects of the Embodiment>

One or more advantageous effects described below are provided according to the embodiment.
(1) By installing the cover in the opening portion, the gas outflow through the opening portion can be suppressed and the gas can be sufficiently diffused throughout the entire buffer chamber. Thus, the amount of the gas supplied via each slits on the inner wall of the buffer chamber can be made uniform in the wafer stacking direction. Particularly, it is possible to sufficiently supply the gas to the wafers at the upper portion of the buffer chamber where the gas is difficult to diffuse. Thus, the amount of the gas supplied to the wafers can be made uniform.
(2) By covering the nozzle base portions with the support portion, the nozzle base portions can be isolated from the atmosphere of the process chamber. As a result, even if the atmosphere in the process chamber is changed according to a situation such as opening of the furnace opening portion, the atmosphere in the support portion is not affected. Thus, the generation of particles can be suppressed. In addition, since the nozzle base portions can be thermally insulated by the support portion, it is possible to keep the temperature at the nozzle base portions and to assist thermal decomposition of the gas, thereby improving the uniformity of the film formation at the surface of the wafer. Further, by assisting the thermal decomposition of the gas, it is possible to supply the gas in a decomposed state in the lower portion of the boat. Thus, the uniformity of the film formation of the substrates can be improved.
(3) By providing the gap between the cover and the partition walls, it is possible to prevent the gas from staying in the nozzle base portions and to suppress generation of particles. When the cover hermetically closes the opening portion, the gas stagnates at the nozzle base portions, and particles may be easily generated in the nozzle chamber. By providing the gap between the cover and the partition walls according to the embodiment, the gas stagnating in the nozzle base portions is discharged to such an extent that particles are not generated in the nozzle chamber and the uniformity of the film formation is not adversely affected. As a result, generation of particles can be suppressed.
(4) By making the cover detachable, the maintenance property is not adversely affected and the productivity can be improved.

While the technique is described in detail by way of the embodiment, the above-described technique is not limited thereto. The above-described technique may be modified in various ways without departing from the gist thereof.

While the embodiment is described by way of an example wherein a short nozzle is used as a nozzle for supplying the source gas, the above-described technique is not limited thereto. For example, the above-described technique may also be applied when a short nozzle is used as a nozzle for supplying the reactive gas. The above-described technique may also be applied when short nozzles are used as both of the nozzle for supplying the source gas and the nozzle for supplying the reactive gas. While the embodiment is described by way of an example wherein a cover is provided at the opening portion of a nozzle chamber where the nozzle for supplying the source gas is provided, the above-described technique is not limited thereto. For example, the above-described technique may also be applied when a cover is provided at the opening portion of a nozzle chamber where the nozzle for supplying the reactive gas is provided. The above-described technique may also be applied when covers are provided at both of the opening portion of the nozzle chamber where the nozzle for supplying the source gas is provided and the opening portion of the nozzle chamber where the nozzle for supplying the reactive gas is provided.

While the embodiment is described by way of an example wherein DCS gas is used as the source gas, the above-described technique is not limited thereto. For example, the above-described technique may also be applied when silane source gas such as HCDS ($Si_2Cl_6$: hexachlorodisilane) gas, MCS ($SiH_3Cl$: monochlorosilane) gas and TCS ($SiHCl_3$: trichlorosilane) gas is used as the source gas. For example, amine-based silane source gas such as 3 DMAS ($Si[N(CH_3)_2]_3H$: tris(dimethylamino)silane) gas) and BTBAS ($SiH_2[NH(C_4H_9)]_2$: bis(tertiarybutylamino)silane) and inorganic halosilane source gas such as MS ($SiH_4$: monosilane) gas and DS ($Si_2H_6$: disilane) gas may be used as the source gas.

While the embodiment is described by way of an example wherein a $SiO_2$ film is formed on the wafer W, the above-described technique is not limited thereto. For example, the above-described technique may also be applied to the formation of a film such as SiN film, SiON film, SiOCN film, SiOC film, SiCN film, SiBN film and SiBCN film. A nitrogen (N)-containing gas (nitriding gas) such as an ammonia ($NH_3$) gas, a carbon (C)-containing gas such as a propylene ($C_3H_6$) gas and a boron (B)-containing gas such as a boron trichloride ($BCl_3$) gas may be used as the reactive gas to form the above-described films. When the above-described technique is applied to the formation process of the above-described films, the processing conditions of film-forming process for the above-described films may be substantially the same as those of the film-forming process according to the embodiment and the same advantageous effects as the embodiment may be obtained.

For example, the above-described technique may also be applied to a formation of a film containing a metal element (metal-based film) such as titanium (Ti), zirconium (Zr), hafnium (Hf), tantalum (Ta), niobium (Nb), aluminum (Al), molybdenum (Mo) and tungsten (W) on the wafer W.

While the embodiment is described by way of an example in which the film is deposited on the wafer W, the above-described technique is not limited thereto. For example, the above-described technique may be applied to the processes such as an oxidation process, diffusion process, an annealing process and an etching process of the wafer W or the film formed on the wafer W.

The above-described embodiment and modified examples may be appropriately combined. The process condition used in the combinations may be the same as, for example, those of the above embodiment or modified examples.

According to the technique described herein, the uniformity of the film formation among the substrates can be improved.

What is claimed is:

1. A substrate processing apparatus comprising:
a reaction tube having a process chamber where a plurality of substrates are processed;
a buffer chamber protruding outward from the reaction tube and configured to supply a process gas to the process chamber, the buffer chamber comprising:
a first nozzle chamber where a first nozzle is provided; and
a second nozzle chamber where a second nozzle is provided;
an opening portion provided at a lower end of an inner wall of the reaction tube facing the buffer chamber, the opening portion including a bottom opening portion of the buffer chamber;
a cylindrical manifold connected to a lower end of the reaction tube, a port being provided on a side wall of the manifold; and
a shielding portion detachably provided over a communicating portion of the opening portion that communicates with the second nozzle chamber and the process chamber,
wherein the shielding portion covers the bottom opening portion of the buffer chamber to suppress a gas outflow from the buffer chamber, and
wherein the shielding portion comprises a plate and a support portion, the plate covering an upper part of the opening portion and the support portion covering a lower part of the opening portion corresponding to a nozzle base portion that is inserted into the port.

2. The substrate processing apparatus of claim 1, wherein a length of the second nozzle is shorter than that of the first nozzle.

3. The substrate processing apparatus of claim 2, wherein the first nozzle comprises a long nozzle having a plurality of gas ejection holes at a side surface thereof, and the second nozzle comprises a short nozzle having a gas ejection hole at a front end thereof.

4. The substrate processing apparatus of claim 3, further comprising:
a substrate retainer configured to support the plurality of substrates and accommodated in the process chamber; and
a heat insulating portion provided below the substrate retainer and accommodated in the process chamber,
wherein the second nozzle is provided such that a height of the gas ejection hole of the second nozzle is same as or lower than a height of a substrate accommodated at a lowermost portion of the substrate retainer.

5. The substrate processing apparatus of claim 4, wherein an oxygen-containing gas is supplied through the first nozzle and a silicon-containing gas is supplied through the second nozzle.

6. The substrate processing apparatus of claim 3, further comprising:
a substrate retainer configured to support the plurality of substrates and accommodated in the process chamber,
wherein the second nozzle is provided such that a height of the gas ejection hole of the second nozzle is same as or lower than a height of a substrate accommodated at a lowermost portion of the substrate retainer.

7. The substrate processing apparatus of claim 2, further comprising:
a second shielding portion provided at a communicating portion between the opening portion and the first nozzle chamber.

8. The substrate processing apparatus of claim 2, wherein the first nozzle comprises a long nozzle having a plurality of gas ejection holes at a side surface thereof.

9. The substrate processing apparatus of claim 2, wherein the second nozzle comprises a short nozzle having a gas ejection hole at a front end thereof.

10. The substrate processing apparatus of claim 1, wherein the support portion is configured to support the plate whereby the buffer chamber and the process chamber are isolated from each other.

11. The substrate processing apparatus of claim 10, wherein the first nozzle chamber and the second nozzle chamber are partitioned by a partition wall provided in the buffer chamber, the plate shields a region of the opening portion corresponding to the partition wall, and the support portion shields another region of the opening portion corresponding to the nozzle base portion below the partition wall.

12. The substrate processing apparatus of claim 11, wherein the plate is made of a material different from that of the support portion.

13. The substrate processing apparatus of claim 12, wherein the plate is made of quartz, and the support portion is made of metal.

14. The substrate processing apparatus of claim 13, wherein the support portion prevents a heat transfer from the process chamber to the nozzle base portion.

15. The substrate processing apparatus of claim 1, wherein the opening portion is configured to enable the first nozzle and a base portion of the first nozzle to be respectively inserted into the first nozzle chamber and a nozzle port through the opening portion.

16. The substrate processing apparatus of claim 1, wherein a gap is provided between the shielding portion and the inner wall so that the shielding portion and the inner wall do not contact each other and the shielding portion does not completely seal the opening portion.

17. A method of manufacturing a semiconductor device, comprising:
(a) transferring a substrate to a process chamber in a reaction tube; and
(b) forming a film on the substrate in the process chamber,
wherein a buffer chamber protrudes outward from the reaction tube, an opening portion is provided at a lower end of an inner wall of the reaction tube facing the buffer chamber and includes a bottom opening portion of the buffer chamber, a first nozzle chamber where a first nozzle is provided and a second nozzle chamber where a second nozzle is provided are provided in the buffer chamber, a shielding portion is provided in a communicating portion between the second nozzle chamber and the process chamber, a cylindrical manifold is connected to a lower end of the reaction tube, and a port is provided on a side wall of the manifold,
wherein the shielding portion comprises a plate and a support portion, the plate covering an upper part of the opening portion and the support portion covering a lower part of the opening portion corresponding to a nozzle base portion that is inserted into the port, and
wherein, in (b), process gases are supplied through the first nozzle chamber and the second nozzle chamber and the shielding portion suppresses a gas outflow from the buffer chamber through the bottom opening portion.

\* \* \* \* \*